United States Patent [19]
Sato

[11] Patent Number: 5,962,890
[45] Date of Patent: Oct. 5, 1999

[54] NON-VOLATILE SEMICONDUCTOR MEMORY

[75] Inventor: Shinichi Sato, Nara, Japan

[73] Assignee: Sharp Kabushiki Kaisha, Osaka, Japan

[21] Appl. No.: 08/841,583

[22] Filed: Apr. 30, 1997

[30] Foreign Application Priority Data

Aug. 29, 1996 [JP] Japan .................................. 8-228902

[51] Int. Cl.$^6$ .................................................. H01L 29/788
[52] U.S. Cl. ............................................ 257/320; 257/322
[58] Field of Search .................................... 257/320, 322

[56] References Cited

U.S. PATENT DOCUMENTS 5,488,245 1/1996 Shimizu .

FOREIGN PATENT DOCUMENTS 61-030063 2/1986 Japan .

OTHER PUBLICATIONS

Muller et al, *Device Electronics for IC's*, pp. 452–454, 1986.

*Primary Examiner*—Stephen Meier
*Attorney, Agent, or Firm*—Nixon & Vanderhye P.C.

[57] ABSTRACT

A non-volatile semiconductor memory in which a plurality of flash memory cells are arranged in a matrix, each flash memory cell including source and drain regions formed on a silicon substrate, a floating gate formed on at least a part of the source and drain regions with a dielectric film provided therebetween, and a control gate formed on the floating gate with a dielectric layer provided therebetween, wherein a writing operation is performed by applying a positive voltage to the drain region and a negative voltage to the control gate and extracting electrons from the floating gate to the drain region by an FN tunnel current, a common source line for connecting the source region of the flash memory cells includes a diffusion layer formed in the silicon substrate and a silicide formed on the diffusion layer, and impurity concentration of the source region and the common source line are set lower than the impurity concentration of the drain region.

5 Claims, 13 Drawing Sheets

| Mode | Method | BL(Vd) | WL(Vg) | SL(Vs) | SB(Vc) |
|---|---|---|---|---|---|
| Write | (He) | 5V | 12V | 0V | 0V |
| Erase | (FE) | OPEN | -10V | 5V | 0V |
| Read |  | 1V | 5V | -- | 0V |

NON-VOLATILE SEMICONDUCTOR MEMORY

BACKGROUND OF THE INVENTION

1. Field of the Invention

The present invention relates to a non-volatile semiconductor memory, and more particularly to a non-volatile semiconductor memory in which an impurity concentration of a source region is set low to make the source region smaller in size, thereby achieving a more highly integrated device and performing writing operation by an FN tunnel current.

2. Description of the Related Art

Conventionally, a flash memory having a floating gate has been used as a non-volatile semiconductor memory. The layout, structure and operation of the flash memory will be described below with reference to FIGS. 14 to 18.

Figure 14:
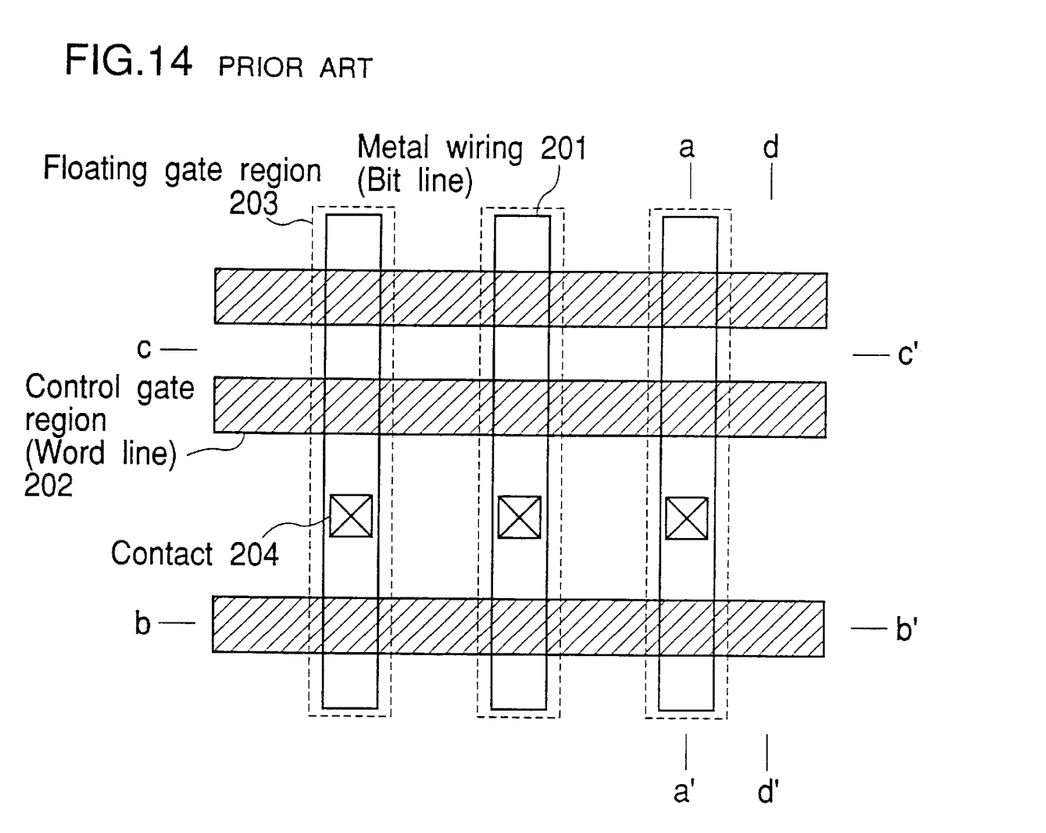
FIG. 14 is a plan view showing a layout of a flash memory according to the prior art.

FIG. 14 is a plan view showing a layout of a flash memory according to the prior art. In a layout of the flash memory where a plurality of memory cells are arranged in a matrix as shown in FIG. 14, 201 denotes a metal wiring for connecting drains of memory cells in common to form a bit line BL, 202 denotes a control gate region for connecting control gates of memory cells in common to form a word line WL, 203 denotes a floating gate region, and 204 denotes a contact for supplying an operating voltage from the metal wiring 201 to each drain.

Figure 15:
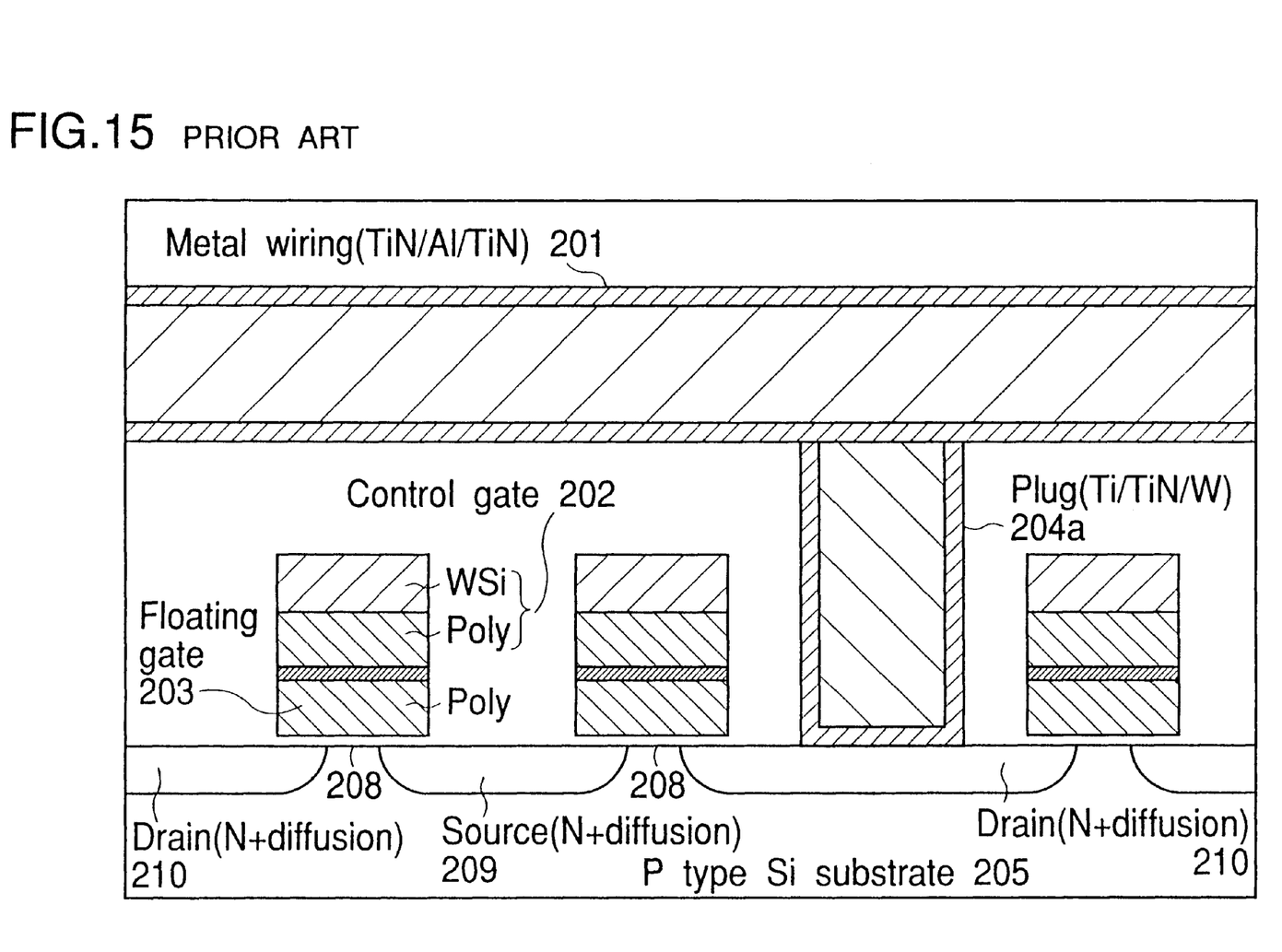
FIG. 15 is a sectional view showing the flash memory according to the prior art, which is taken along the line a–a' in FIG. 14.
Figure 16:
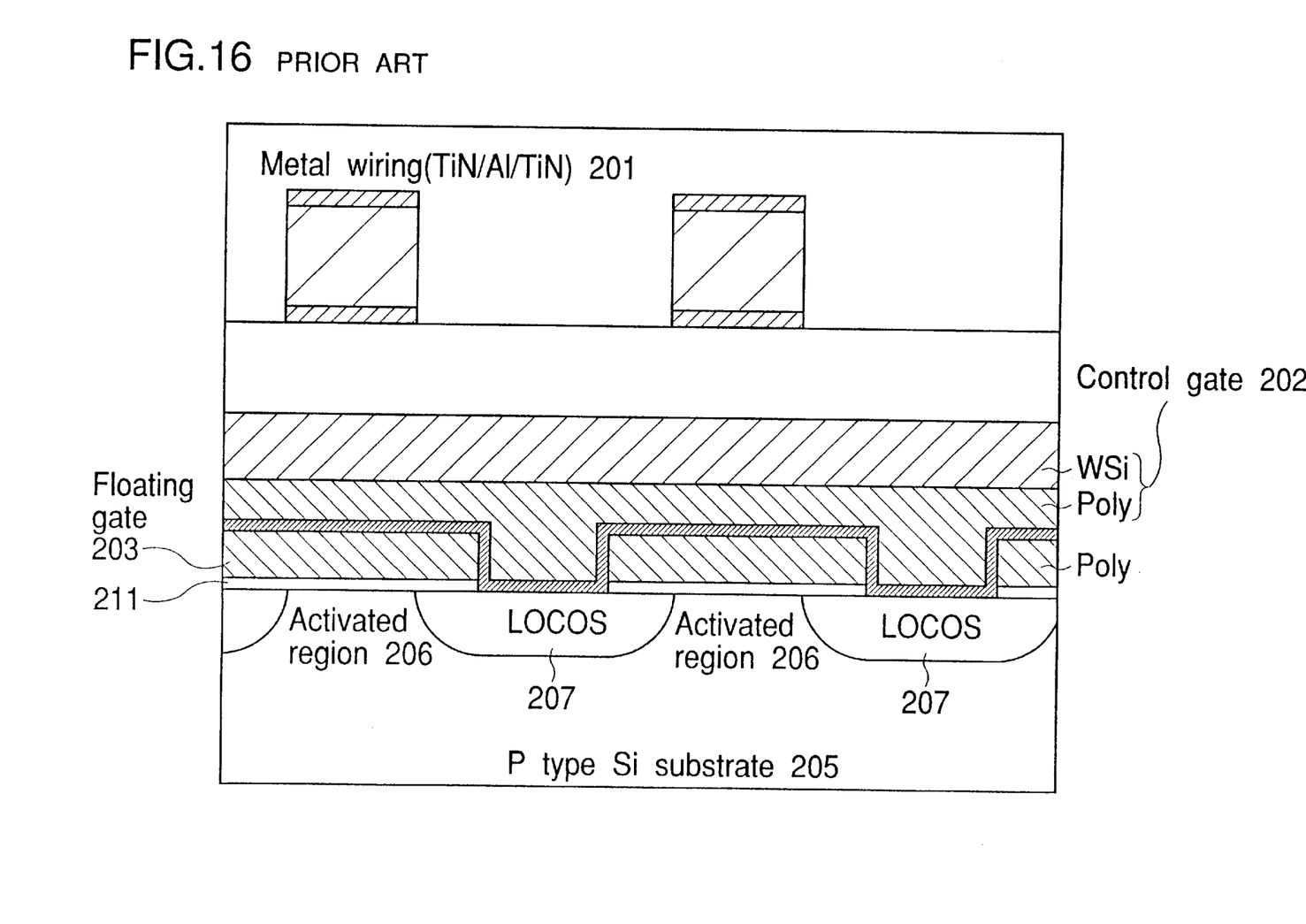
FIG. 16 is a sectional view showing the flash memory according to the prior art, which is taken along the line b–b' in FIG. 14.
Figure 17:
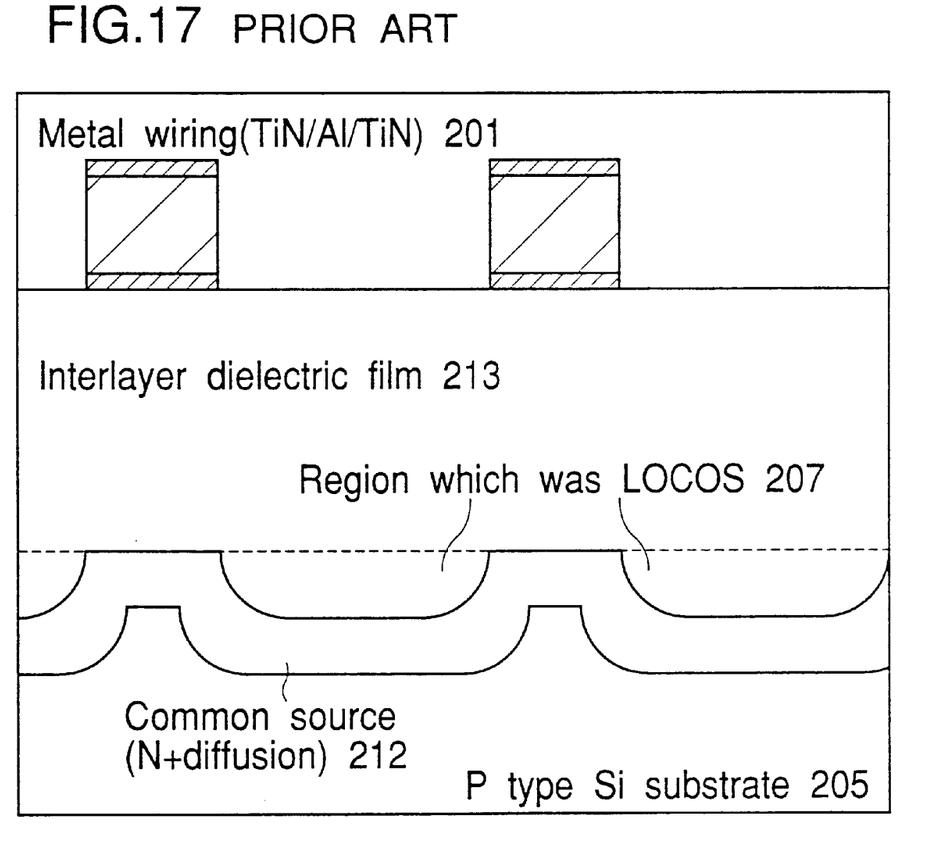
FIG. 17 is a sectional view showing the flash memory according to the prior art, which is taken along the line c–c' in FIG. 14.

FIG. 15 is a sectional view showing the flash memory according to the prior art, which is taken along the line a–a' in FIG. 14. FIG. 16 is a sectional view showing the flash memory according to the prior art, which is taken along the line b–b' in FIG. 14. FIG. 17 is a sectional view showing the flash memory according to the prior art, which is taken along the line c–c' in FIG. 14.

An example of a structure of the flash memory according to the prior art will be described below with reference to FIGS. 15 to 17.

As an example of the structure of the flash memory according to the prior art, a memory cell is formed on a P type silicon substrate 205 and an active region 206 is defined on the surface of the silicon substrate 205 by forming a device isolation region 207 (LOCOS oxide film) using a LOCOS (Local Oxidation of Silicon) method (FIG. 16). A channel region 208, a source region (an N+ diffusion layer) 209 and a drain region (N+ diffusion layer) 210 are formed in the active region 206. The channel region 208 is formed between the source region 209 and the drain region 210 (FIG. 15). A contact hole 204a is formed on the drain region 210. The contact hole 204a is filled with a tungsten plug on which the metal wiring 201 serving as the bit line BL is provided (FIG. 15).

A tunnel oxide film 211 is formed on the active region 206. Furthermore, a floating gate 203 comprising an N+polysilicon (Poly Si) layer is formed to cover the tunnel oxide film 211 and a part of the device isolation region 207 (FIG. 16). The floating gate 203 is covered with a three-layered film comprising an oxide film, a nitride film and an oxide film on which a control gate 202 comprising a tungsten polycide (WSi-Poly Si) is formed vertically in self-alignment with the floating gate 203 (FIG. 16). The control gate 202 forms the word line WL perpendicular to the metal wiring 201.

On a side in a space between the control gates where the source region 209 is formed, the LOCOS oxide film is removed and a common source line 212 composed of a N+diffusion layer and arranged in parallel with the word line WL is formed. Furthermore, an interlayer dielectric film 213 is formed on the common source line 212 (FIG. 17).

Figure 18A:
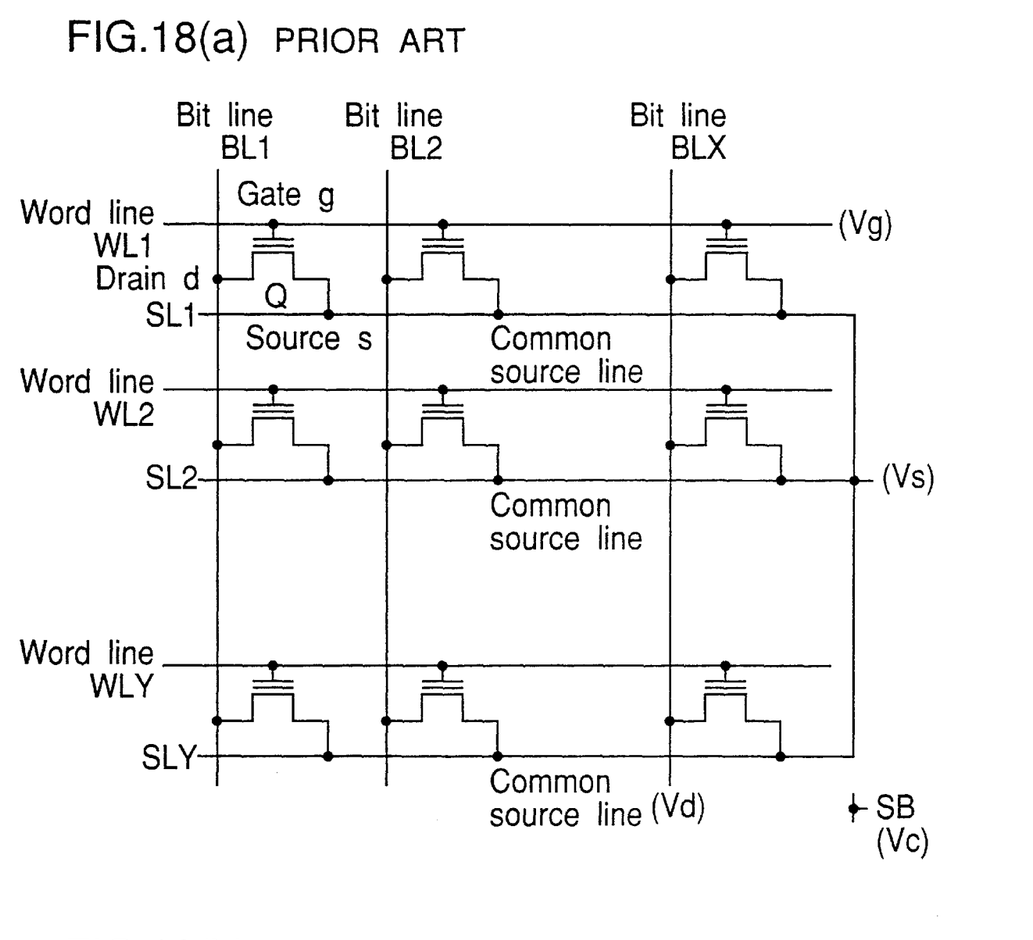
FIG. 18 is a diagram showing a equivalent curcuit and an operating voltage during operation of the flash memory according to the prior art.
Figure 18B:
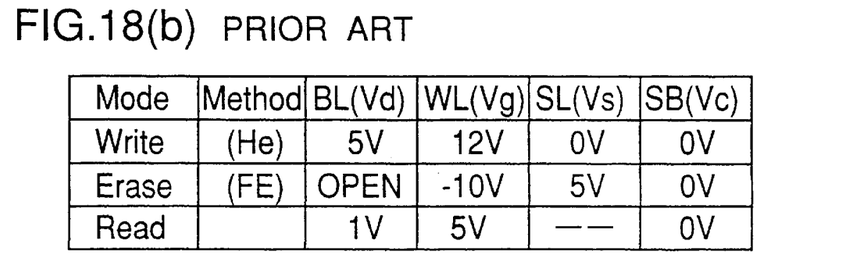

FIG. 18 is a diagram showing an equivalent curcuit and an operating voltage during operation of the flash memory according to the prior art. In FIG. 18, a plurality of memory cells Q are arranged in a matrix, a plurality of bit lines BL connected to drains d of the memory cells Q are wired longitudinally, a plurality of word lines WL connected to control gates g of the memory cells are wired laterally, and a plurality of common source lines SL connected to sources s of the memory cells are wired in parallel with the word lines WL.

The operaion voltage in performing writing, erasing and reading of the flash memory according to the prior art is as follows. The writing operation is performed by applying a voltage of 5 V to a selected bit line BL, a voltage of 12 V to a selected word line WL, and a voltage 0 V to a source line SL and a substrate SB to inject hot electrons into the floating gate 203. The erasing operation is performed by applying a voltage of 5 V to a source line SL, −10 V to a word line WL and 0 V to a substrate SB, and making the bit line BL open to extract the electrons from the floating gate 203 to the source line SL by an FN (Fowler-Nordheim) tunnel current. The reading operation is performed by applying a voltage of 1 V to a selected bit line BL, 5 V to a selected word line WL and 0 V to a substrate SB and determining whether or not a current flows to the source of the selected memory cell.

In the flash memory according to the prior art, however, an efficiency of generation of the hot electrons should be maintained during the writing operation, the FN tunnel current should be prevented from being lowered during the erasing operation, and high-speed random access operation should be maintained during the reading operation. For this reason, it is necessary to reduce a resistance value of the diffusion layer of the common source line in respect of the structure of the flash memory according to the prior art, for example. Consequently, a dosage of impurities implanted into the diffusion layer of the common source line should be increased.

As a well-known example in which a source resistance value of the diffusion layer of the common source line is reduced, Japanese Unexamined Patent Publication No. SHO 61(1986)-30063 has proposed a non-volatile semiconductor memory in which N type impurities are implanted with high dosage into a common source line region and a refractory metal silicide is then formed on a surface of the common source line region in self-alignment.

According to the non-volatile semiconductor memory disclosed in the Japanese Unexamined Patent Publication No. SHO 61(1986)-30063, the resistance is reduced by using a silicide so as to fully perform the writing operation by hot electrons. However, there are the following problems.

1. Since electrons are extracted toward a source during erasing operation, impurity concentration of the source region cannot be reduced, so that the length of the source region cannot be reduced (the channel length cannot be reduced).
2. Since arsenic exists at a high concentration in the source, the resistance of the silicide is increased when the source region is reduced.

SUMMARY OF THE INVENTION

In consideration of the foregoing, it is an object of the present invention to provide a non-volatile semiconductor memory in which a well-known FN tunnel current is used so that an operating voltage is not applied to a common source line but writing and erasing operation of the memory cell is fully performed, a silicide is formed on a surface of a source region having a lower concentration of arsenic than that of a drain region so that a source resistance value can be prevented from being increased even if the width of the common source line is reduced with the same impurities and silicide being formed as in the prior art, and the memory cell can be made finer without damaging the advantages of high-speed random access.

The present invention provides a non-volatile semiconductor memory in which a plurality of flash memory cells are arranged in a matrix, each flash memory cell comprising source and drain regions formed on a silicon substrate, a floating gate formed on at least a part of the source and drain regions with a dielectric film provided therebetween, and a control gate formed on the floating gate with a dielectric layer provided therebetween, wherein a writing operation is performed by applying a positive voltage to the drain region and a negative voltage to the control gate and extracting electrons from the floating gate to the drain region by an FN tunnel current, a common source line for connecting the source region of the flash memory cells includes a diffusion layer formed in the silicon substrate and a silicide formed on the diffusion layer, and impurity concentration of the source region and the common source line are set lower than the impurity concentration of the diffusion layers of the drain region.

DESCRIPTION OF PREFERRED EMBODIMENTS

The present invention relates to a non-volatile semiconductor memory (a flash memory) in which a plurality of flash memory cells are arranged in a matrix, each flash memory cell comprising source and drain regions formed on a silicon substrate, a floating gate formed on at least a part of the source and drain regions with a dielectric film provided therebetween, and a control gate formed on the floating gate with a dielectric layer provided therebetween.

In operation of the flash memory according to the present invention, an FN tunnel writing method is used in which a flow of the electrons is reverse to that of the writing operation according to the prior art. In other words, erasing operation is performed by storing electrons in the floating gate and writing operation is performed by extracting electrons from the floating gate by the FN tunnel current.

For example, the writing operation is performed by applying a voltage of 5 V to a selected bit line (drain), –10 V to a selected word line (control gate), and 0 V to a substrate and a common source line.

The erasing operation is performed by applying a voltage of –8 V to the bit line and the substrate, 8 V to the word line, and –8 V to the common source line. Accordingly, a high operating voltage is not applied to a source side during the writing and erasing operations. However, since reading operation is performed in the same manner as in the prior art, an advantage that the non-volatile semiconductor memory is suitable for high-speed random access operation is still retained.

In a structure, the concentration of arsenic in the source region is lowered much more than that of the drain region to shallow the source region. In addition, a titanium silicide layer is formed on a surface of the diffusion layer of the common source line to have a low resistance common source line.

For example, the drain region contains arsenic (As), and has a concentration of about $1 \times 10^{20}/cm^3$ and a diffusion length of the drain region of about 0.15 $\mu$m. The source region also contains arsenic, and preferably has a concentration of about $1\times10^{18}$ to $1\times10^{19}/cm^3$ and a diffusion length of the source region of about 0.02 to 0.10 μm.

According to the structure of the present invention, the diffusion length is reduced by considerably lowering the concentration of the source region. Consequently, a channel length can be reduced, threrby achieving a more highly integrated device.

An embodiment of the present invention will be described below in detail with reference to the drawings. The present invention is not restricted to the following embodiment. A non-volatile semiconductor memory according to the present invention is particularly applied to high-speed reading of various data in an electronic data processing apparatus such as a computer, a word processor and an electronic notebook.

Figure 1:
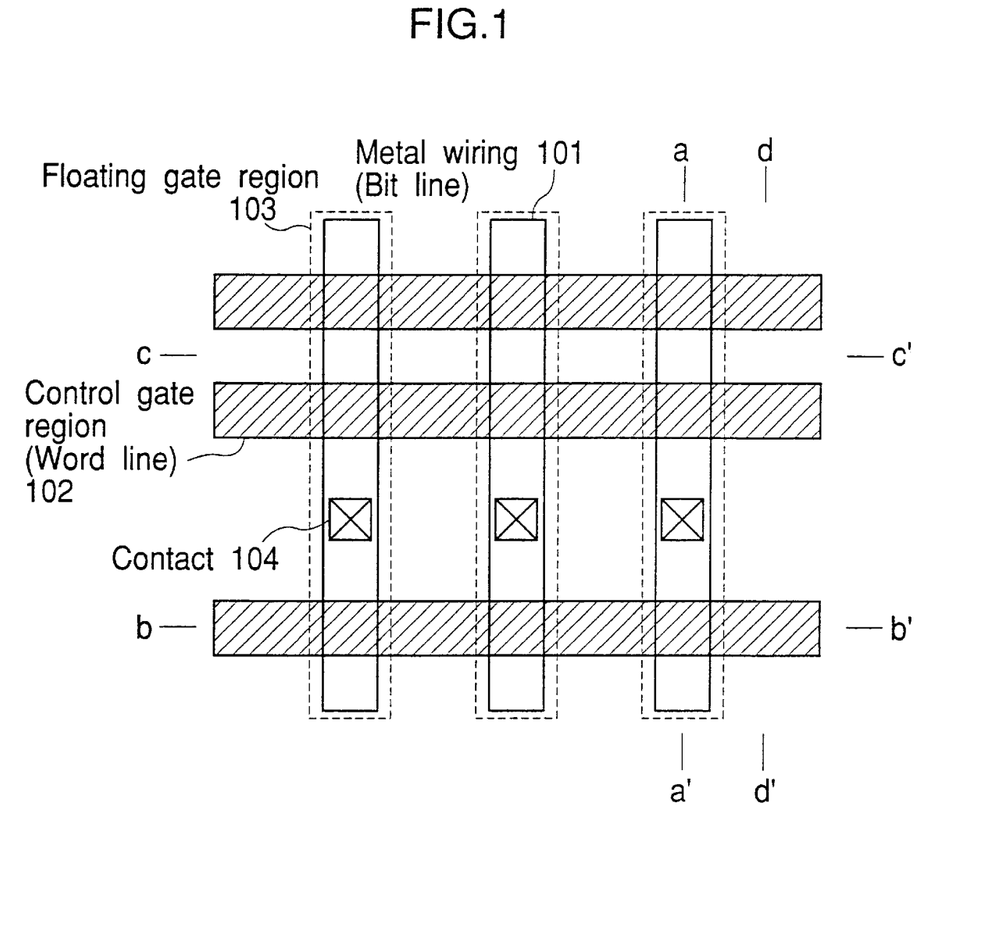
FIG. 1 is a plan view showing a layout of a flash memory according to an embodiment of the present invention.

FIG. 1 is a plan view showing a layout of a flash memory according to the present embodiment. In a layout of the flash memory where a plurality of memory cells are arranged in a matrix as shown in FIG. 1, 101 denotes a metal wiring for connecting drain layers of a memory cell array in common to form a bit line BL, 102 denotes a control gate region for connecting control gates of the memory cell array in common to form a word line WL (which is shown by hatching), 103 denotes a floating gate region (which is shown by a dotted line), and 104 denotes a contact for applying an operating voltage from the metal wiring 101 to each drain.

Figure 2:
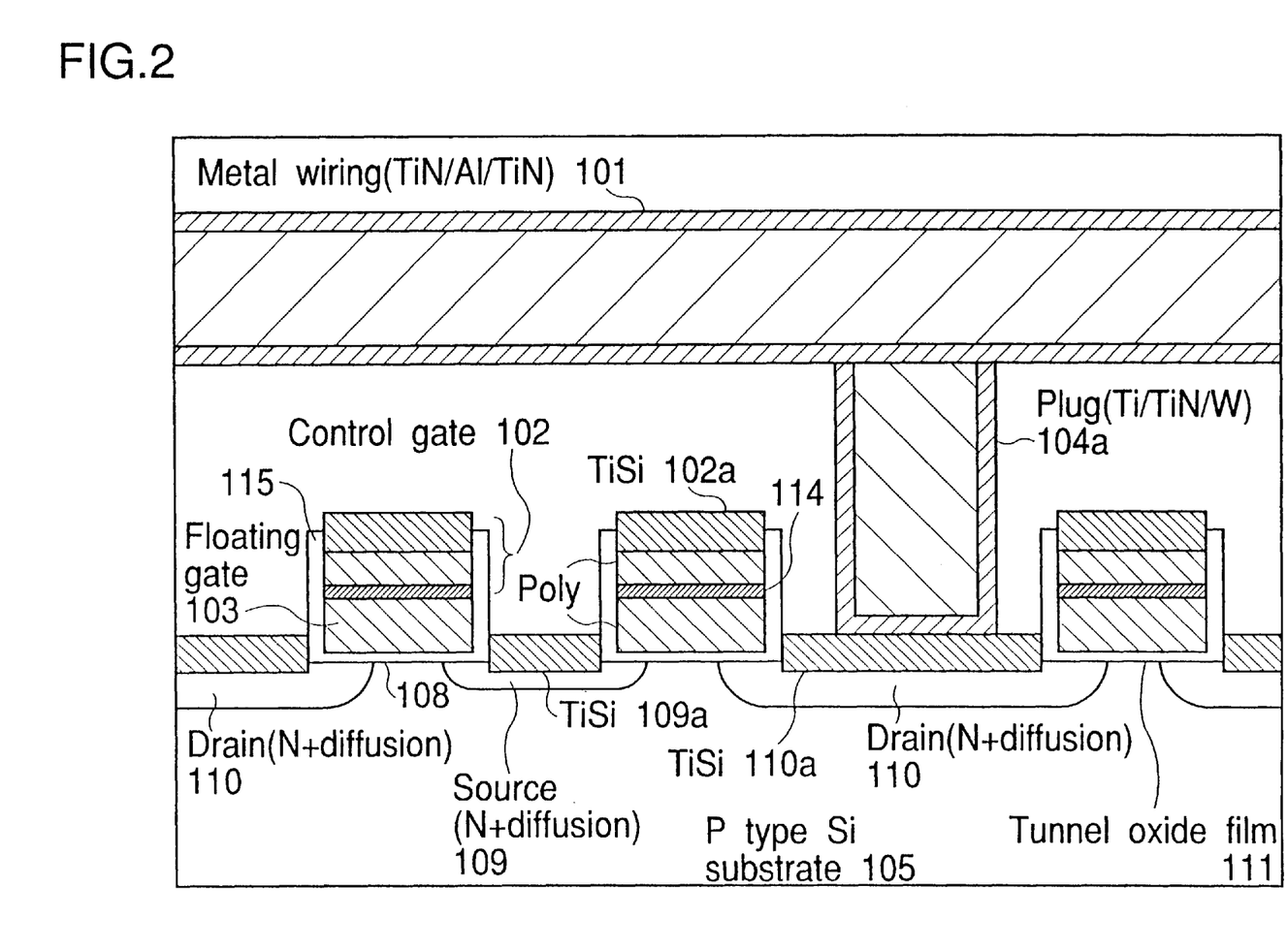
FIG. 2 is a sectional view showing the flash memory according to the embodiment of the present invention, which is taken along the line a–a' in FIG. 1.
Figure 3:
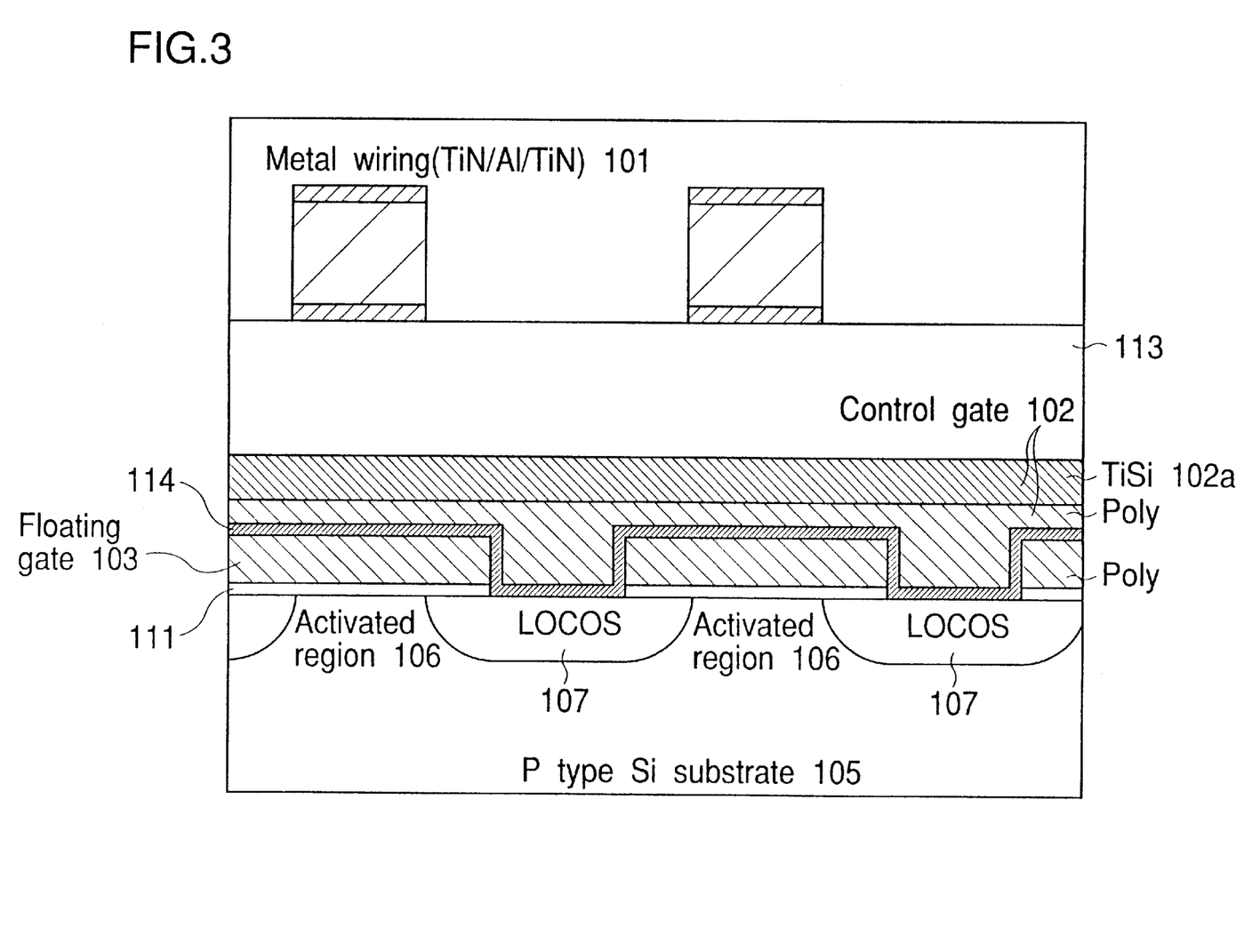
FIG. 3 is a sectional view showing the flash memory according to the embodiment of the present invention, which is taken along the line b–b' in FIG. 1.
Figure 4:
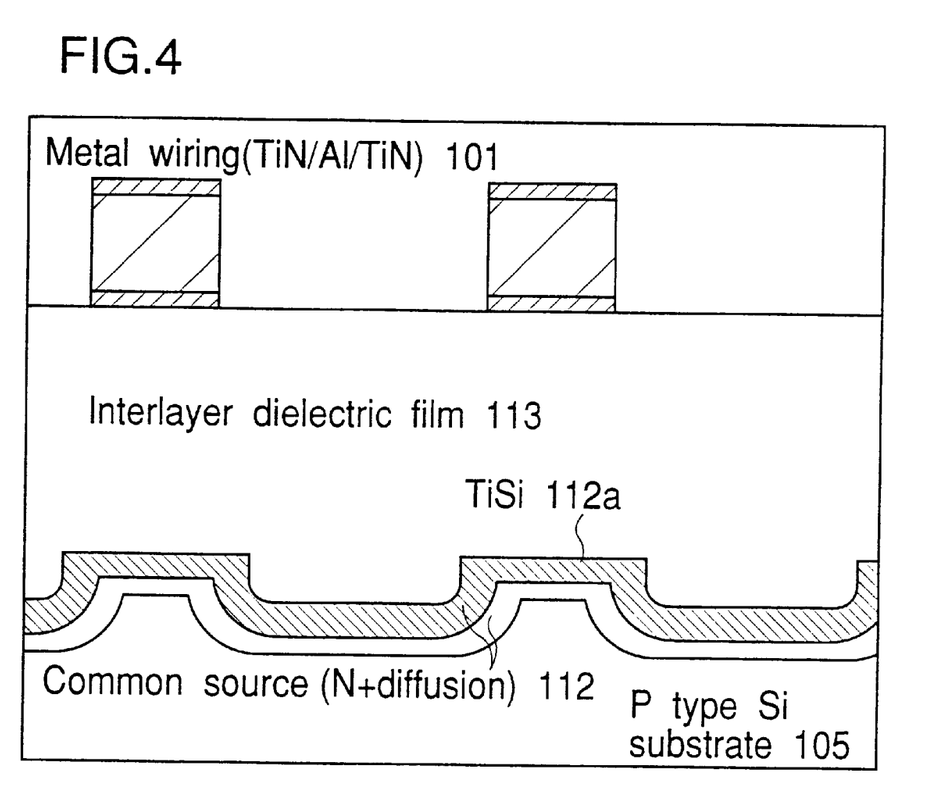
FIG. 4 is a sectional view showing the flash memory according to the embodiment of the present invention, which is taken along the line c–c' in FIG. 1.

FIG. 2 is a sectional view showing a flash memory according to the present embodiment, which is taken along the line a–a' in FIG. 1. FIG. 3 is a sectional view showing the flash memory according to the present embodiment, which is taken along the line b–b' in FIG. 1. FIG. 4 is a sectional view showing the flash memory according to the present embodiment, which is taken along the line c–c' in FIG. 1.

An example of a structure of the flash memory according to the present embodiment will be described below with reference to FIGS. 2 to 4. As an example of the structure of the flash memory according to the present embodiment, memory cells are formed on a P type silicon substrate 105. An active region 106 is defined on the surface of the silicon substrate 105 by forming a device isolation region 107 (having a thickness of 300 nm, for example) using a LOCOS (Local Oxidation of Silicon) method (FIG. 3). A channel region 108, a source diffusion layer 109 and a drain diffusion layer 110 are formed in the active region 106. The channel region 108 is formed between the source diffusion layer 109 and the drain diffusion layer 110 (FIG. 2).

The drain diffusion layer 110 is formed of arsenic (As), and has a concentration of about $1\times10^{20}/cm^3$ and a diffusion length of about 0.15 μm. The source diffusion layer 109 is also formed of arsenic, and has a low concentration of about $1\times10^{18}/cm^3$ and a short diffusion length of about 0.05 μm (FIG. 2).

A tunnel oxide film 111 (having a thickness of 10 nm, for example) is formed on the active region 106. Furthermore, a floating gate 103 comprising a polysilicon (Poly Si) layer doped with phosphorus (P) is formed to cover the tunnel oxide film 111 and a part of the device isolation region 107 (LOCOS oxide film) (FIG. 3).

The floating gate 103 is covered with a three-layered film comprising an oxide film, a nitride film and an oxide film (having thicknesses of 5 nm, 8 nm and 6 nm, for example) on which a control gate 102 comprising a titanium silicide 102a and a polysilicon 102b is formed vertically in self-alignment with the floating gate 103 (FIG. 2). The control gate 102 forms a word line WL perpendicular to the metal wiring 101.

On a side where the source diffusion layer 109 is formed, the LOCOS oxide film is removed and a diffusion layer of a common source line 112 is formed in parallel with the word line WL. Titanium silicides 109a and 110a are formed on surfaces of the source diffusion layer 109 and the drain diffusion layer 110 on both sides of an oxide film on a side wall 115 (FIG. 2). The common source line 112 has a wiring having a low resistance (FIG. 4). An interlayer dielectric film 113 is formed on the common source line 112, and the metal wiring 101 serving as the bit line is formed on the interlayer dielectric film 113 (FIG. 4).

The titanium silicide 112a forming the word line WL and the common source line 112 has a layer resistance of about 2 Ω/□. The silicide 110a on the drain diffusion layer 110 has a high layer resistance of about 10 Ω/□ because it has a high concentration.

A contact hole 104a is formed on the silicide 110a provided on the drain diffusion layer 110. The contact hole 104a is filled with a tungsten plug (W plug) on which the metal wiring 101 serving as the bit line BL is formed.

FIGS. 5 to 12 are sectional views showing steps (1) to (7) of manufacturing the flash memory according to the present embodiment in FIG. 1. The manufacturing steps (1) to (7) according to the present embodiment will be described below with reference to FIGS. 5 to 12.

Figure 5:
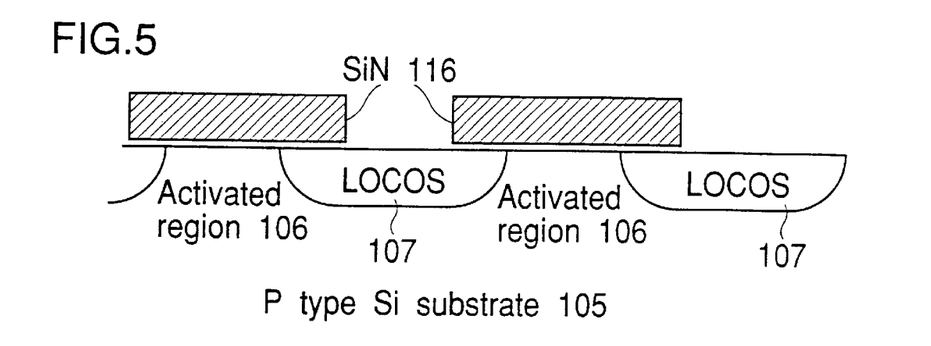
FIG. 5 is a sectional view showing a step (1) of manufacturing the flash memory according to the embodiment of the present invention, which is taken along the line b–b' in FIG. 1.

In the manufacturing step (1) shown in FIG. 5, an oxide film having a thickness of 15 nm is formed on a P type silicon substrate 105, and a silicon nitride (SiN) film having a thickness of 150 nm is deposited on the oxide film. Subsequently, a photoresist is left by photolithography in only a portion which will be an active region 106. By using the photoresist as a mask, the silicon nitride film in a portion which will be a device isolation region (LOCOS oxide film) 107 is selectively removed. Furthermore, the P type silicon substrate 105 is etched by a thickness of about 100 nm. Then, the isolation region 107 is formed in a thickness of 300 nm.

Figure 6:
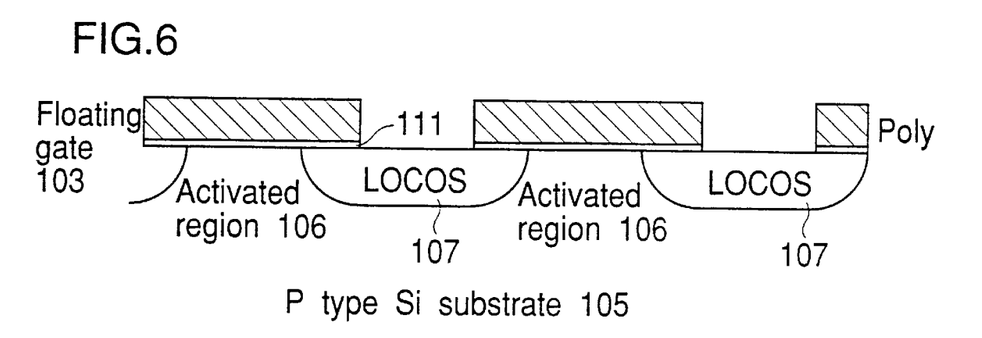
FIG. 6 is a sectional view showing a step (2) of manufacturing the flash memory according to the embodiment of the present invention, which is taken along the line b–b' in FIG. 1.

In the manufacturing step (2) shown in FIG. 6, the silicon nitride film is removed, and the oxide film formed thereunder is also removed. In order to increase the P type concentration of a portion formed just under the device isolation region 107 and in a surface of the silicon substrate 105, boron ions are implanted at a dosage of $5\times10^{12}/cm^2$ with energies of 30 kev and 100 keV. Then, a tunnel oxide film 111 having a thickness of 10 nm is newly formed. A polysilicon which will be a floating gate 103 is deposited on the tunnel oxide film 111 in a thickness of 150 nm. In order to set the polysilicon to an N+ type, phosphorus (P) ions are implanted at a dosage of $1\times10^{15}/cm^2$. Then, the polysilicon is patterned so as to cover the active region 106.

Figure 7:
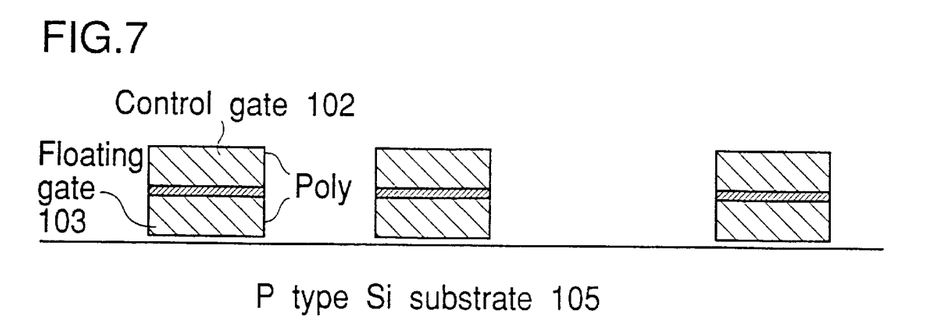
FIG. 7 is a sectional view showing a step (3) of manufacturing the flash memory according to the embodiment of the present invention, which is taken along the line a–a' in FIG. 1.

In the manufacturing step (3) shown in FIG. 7, an oxide film having a thickness of 5 nm is formed on the polysilicon. Then, a SiN film and a CVD (Chemical Vapor Deposition) oxide film are deposited in thicknesses of 8 nm and 6 nm, respectively (an ONO film). Thereafter, a polysilicon is deposited in a thickness of 150 nm. In order to set the polysilicon to an N+ type, phosphorus ions are implanted at a dosage of $5\times10^{15}/cm^2$. Subsequently, a pattern serving as the word line WL is formed by photolithography. By using the pattern as a mask, the second layer polysilicon, the ONO film 114 (a three layered film comprising the silicon oxide film/silicon nitride film/silicon oxide film), and the first layer polysilicon are sequentially etched.

Figure 8:
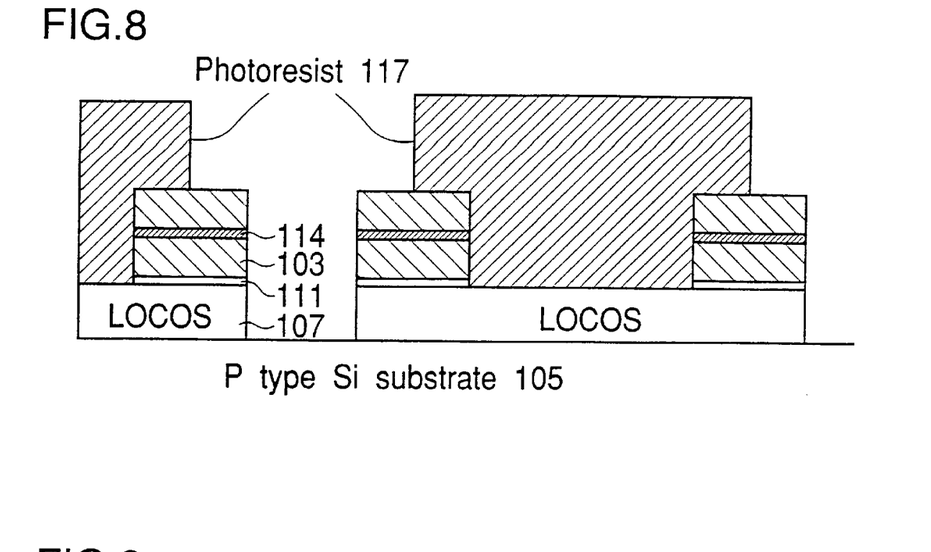
FIG. 8 is a sectional view showing a step (4) of manufacturing the flash memory according to the embodiment of the present invention, which is taken along the line d–d' in FIG. 1.

In the manufacturing step (4) shown in FIG. 8, a photoresist pattern 117 is formed so as to cover a space between the word lines on a drain side. The LOCOS oxide film 107 on a source side is removed by using the photoresist pattern and the second layer polysilicon as masks.

Figure 9:
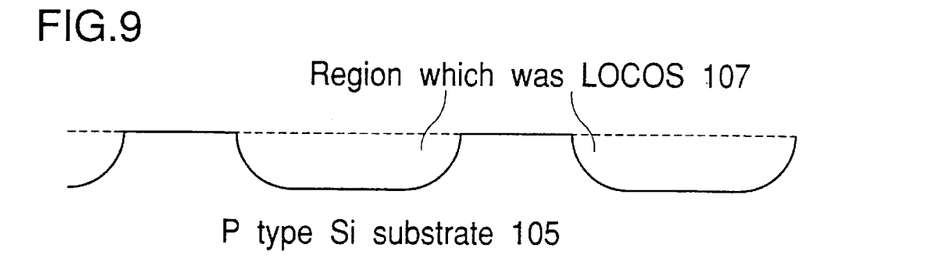
FIG. 9 is a sectional view showing a step (5) of manufacturing the flash memory according to the embodiment of the present invention, which is taken along the line c–c' in FIG. 1.

In the manufacturing step (5) shown in FIG. 9, selective oxidation may be performed so as not to form the LOCOS oxide film on the common source line when forming the LOCOS oxide film as an alternative method. In this case, it is necessary to align the common source line and the word line.

Figure 10:
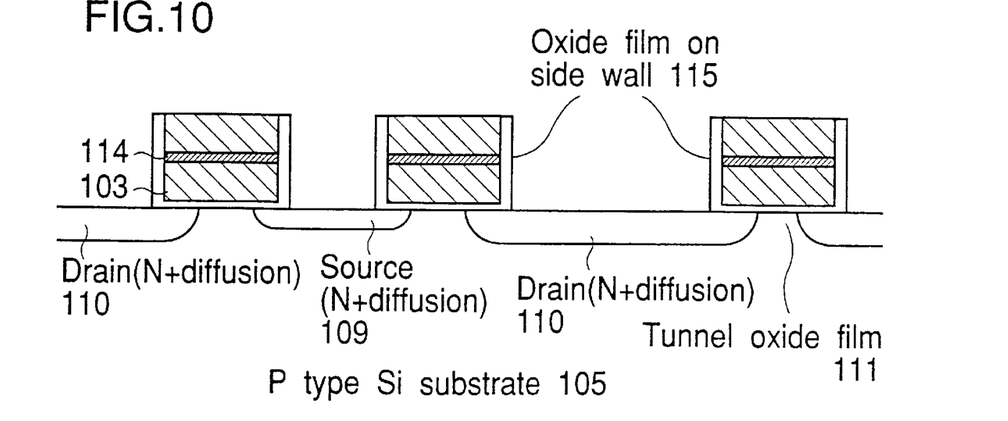
FIG. 10 is a sectional view showing a step (6) of manufacturing the flash memory according to the embodiment of the present invention, which is taken along the line a–a' in FIG. 1.

In the manufacturing step (6) shown in FIG. 10, arsenic ions are implanted at a dosage of $5 \times 10^{13}/cm^2$ with an energy of 20 keV. Then, a photoresist pattern 117 is formed so as to cover a space between word lines on a source side. By using the photoresist pattern 117 as a mask, arsenic ions are implanted into only the drain side at a dosage of $3 \times 10^{15}/cm^2$ with an energy of 20 keV.

By thermal oxidation, an oxide film is formed in a thickness of 50 nm on a side wall of the first layer polysilicon, a side wall and an upper face of the second layer polysilicon, and the active region. Then, a CVD oxide film is deposited in a thickness of 20 nm. Thereafter, anisotropic etching is performed to leave the oxide film 115 formed on the side wall and to remove the oxide film formed on the second layer polysilicon and the activated region.

Figure 11:
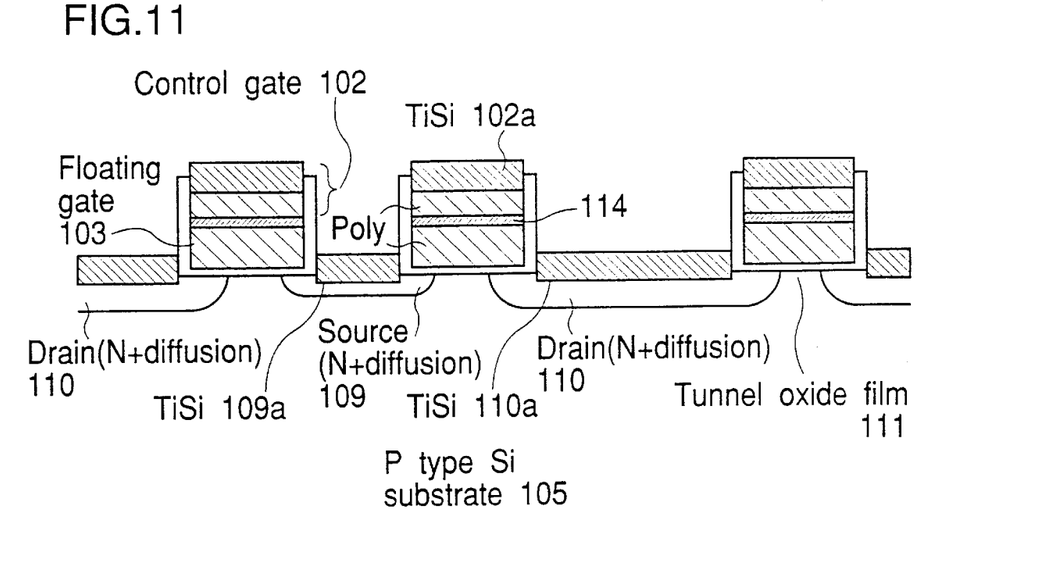
FIG. 11 is a sectional view showing a step (7) of manufacturing the flash memory according to the embodiment of the present invention, which is taken along the line a–a' in FIG. 1.

In the manufacturing step (7) shown in FIG. 11, titanium (Ti) is deposited in a thickness of 50 nm over the entire surface, and is annealed for 1 minute at a temperature of 650° C. to react titanium with silicon so as to form a titanium silicide in a region where silicon is in contact with titanium. Subsequently, unreacted titanium is removed by using a mixed solution of sulfuric acid and hydrogen peroxide.

Figure 12:
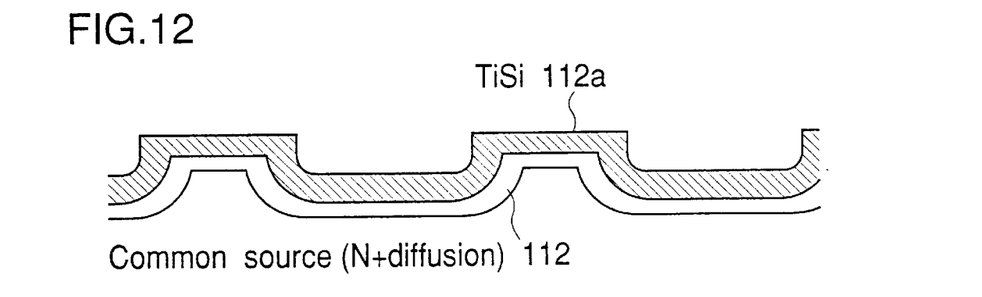
FIG. 12 is a sectional view showing the step (7) of manufacturing the flash memory according to the embodiment of the present invention, which is taken along the line c–c' in FIG. 1.

In FIG. 12 which shows a different cross section of the manufacturing step (7), the LOCOS oxide film is removed on a side where the source diffusion layer 109 is formed, a diffusion layer of the common source line 112 is formed, and a titanium silicide is formed on the diffusion layer.

A CVD oxide film is deposited in a thickness of 1200 nm as an interlayer dielectric film 113, and is flattened by CMP (chemical/mechanical polishing). A contact hole 104a is formed. Then, a wiring is formed (FIGS. 2 to 4).

Figure 13A:
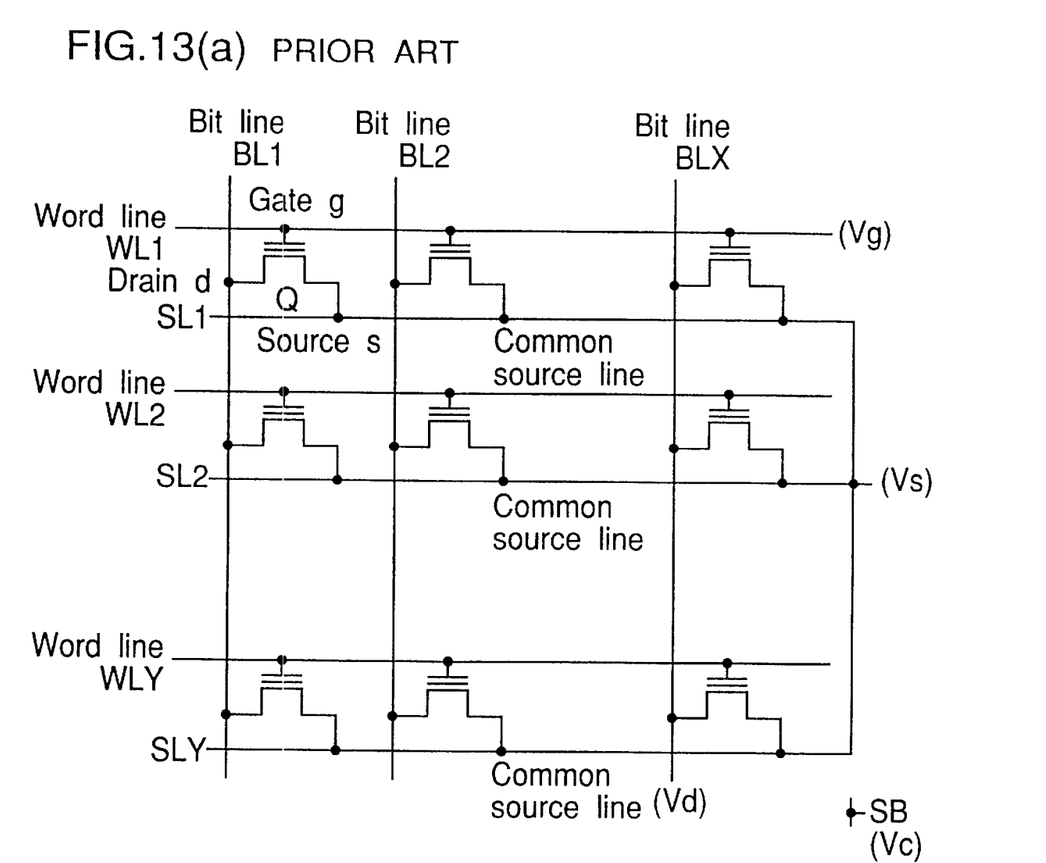
FIG. 13 is a diagram showing a equivalent circuit and an operating voltage during operation of the flash memory according to the embodiment of the present invention.
Figure 13B:
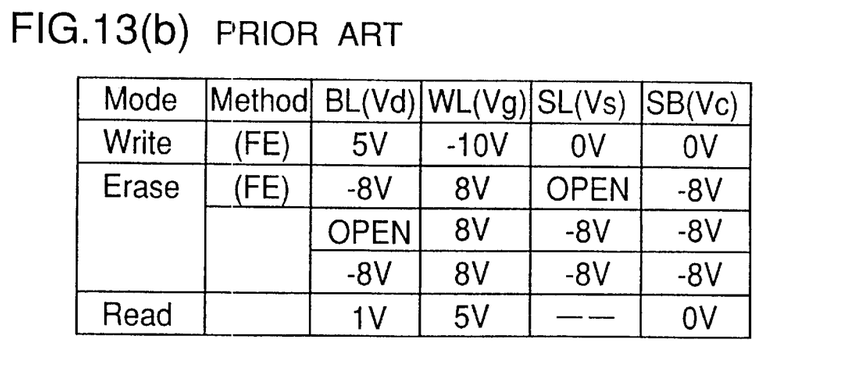

FIG. 13 is a diagram showing a equivalent circuit and an operating voltage during operation of the flash memory according to the present embodiment. In FIG. 13, a plurality of memory cells Q are arranged in a matrix, a plurality of bit lines BL connected to drains d of the memory cells Q are wired longitudinally, a plurality of word lines WL connected to control gates g of the memory cells Q are wired laterally, and a plurality of common source lines SL connected to sources s of the memory cells are wired in parallel with the word lines WL.

The writing, erasing and reading operation of the flash memory according to the present embodiment will be described below. This writing operation is generally referred to as an FN tunnel writing method, in which a voltage of 5 V is applied to a selected bit line BL,–10 V to a selected word line WL, and 0 V to a substrate SB and a common source line SL to extract electrons from the floating gate to the drain by an FN tunnel current.

The erasing operation is performed by applying a voltage of –8 V to the source line SL and the substrate SB, leaving the bit line BL open or applying a voltage of –8 V to the bit line BL, and applying a voltage of 8 V to a word line WL on which the erasure is to be performed or to all the word lines when performing a total-erasure and storing electrons in the floating gate.

Accordingly, a high operating voltage is not applied to the source side when performing the writing and erasing operation.

The reading operation is performed in the same manner as in the prior art by applying a voltage of 1 V to a selected bit line BL, 5 V to a selected word line WL and 0 V to the substrate SB and determining whether or not a current flows to a source of the selected memory cell. Since the reading operation is performed in the same manner as in the prior art, an advantage that the non-volatile semiconductor memory is suitable for high-speed random access operation is still retained.

According to the present invention, an FN tunnel current is used so that the source is not used when performing the writing and erasing operation. Therefore, the concentration of the source diffusion layer is set lower than that of the drain diffusion layer so that a junction of the source diffusion layer can be made shallow. Consequently, the concentration of the source diffusion layer can be considerably lowered so that the diffusion length can be reduced. As a result, the channel length can be reduced. Thus, a more highly-integrated flash memory with smaller memory cells can be provided.

Although the present invention has been fully described by way of example with reference to the accompanying drawings, it is to be understood that various changes and modifications will be apparent to those skilled in the art. Therefore, unless such changes and modifications depart otherwise from the scope of the invention, they should be construed as being included therein.

What is claimed is:

1. A non-volatile semiconductor memory in which a plurality of flash memory cells are arranged in a matrix, each flash memory cell comprising:

source and drain regions in a silicon substrate;

a floating gate overlapping at least a part of the source and drain regions, with a first dielectric film between the floating gate and substrate; and a control gate on the floating gate, with a second dielectric layer between the control gate and the floating gate, wherein an FN (Fowler-Nordheim) tunnel current is formed between the floating gate and drain region when a positive voltage is applied to the drain region and a negative voltage is applied to the control gate to move electrons from the floating gate to the drain region during a writing operation, a common source line connecting the source regions of the flash memory cells includes a diffusion layer formed in the silicon substrate and a silicide formed on the diffusion layer, and impurity concentration levels of the source region and the common source line are lower than an impurity concentration level of the drain region.

2. The non-volatile semiconductor memory as defined in claim 1, wherein the silicide of the common source line is self-aligned with the diffusion layer.

3. The non-volatile semiconductor memory as defined in claim 1, wherein the source region, the common source line and the drain region each contain arsenic.

4. The non-volatile semiconductor memory as defined in claim 1, wherein the silicide is a titanium silicide.

5. A non-volatile semiconductor memory in which a plurality of flash memory cells are arranged in a matrix, each flash memory cell comprising:

source and drain regions in a silicon substrate;

a floating gate overlapping at least a part of the source and drain regions, with a first dielectric film between the floating gate and the substrate; and a control gate on the floating gate, with a second dielectric layer between the control gate and the floating gate, a common source line connecting the source regions of the flash memory cells includes a diffusion layer formed in the silicon substrate and a silicide formed on the diffusion layer, and impurity concentration levels of the source region and the common source line are lower than an impurity concentration level of the drain region;

wherein, during a writing operation, an FN (Fowler-Nordheim) tunnel current forms between the floating gate and the drain region upon application of a positive voltage to the drain region and of a negative voltage to the control gate to move electrons from the floating gate to the drain region, and wherein, during an erasing operation, FN tunnel current is formed between the drain region and the floating gate upon application of a negative voltage to the drain region, a negative voltage to the substrate, and a positive voltage to the control gate to move electrons from the drain region to the floating gate.

* * * * *